(12) United States Patent
Lehtola

(10) Patent No.: US 12,483,205 B2
(45) Date of Patent: Nov. 25, 2025

(54) POWER AMPLIFIER JUNCTION TEMPERATURE CLAMP

(71) Applicant: SKYWORKS SOLUTIONS, INC., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 563 days.

(21) Appl. No.: 17/955,345

(22) Filed: Sep. 28, 2022

(65) Prior Publication Data

US 2023/0112095 A1    Apr. 13, 2023

Related U.S. Application Data

(60) Provisional application No. 63/249,856, filed on Sep. 29, 2021.

(51) Int. Cl.
H03F 3/45 (2006.01)
H03F 1/52 (2006.01)
H03F 3/24 (2006.01)

(52) U.S. Cl.
CPC ............... *H03F 1/52* (2013.01); *H03F 3/245* (2013.01); *H03F 2200/451* (2013.01)

(58) Field of Classification Search
CPC ....................................................... H03F 3/45
USPC ............................................................ 330/252
See application file for complete search history.

(56) References Cited

U.S. PATENT DOCUMENTS

| | | | | |
|---|---|---|---|---|
| 3,757,137 A | * | 9/1973 | Ahmed | ............... H03K 3/2897 327/535 |
| 5,323,068 A | * | 6/1994 | Freitas | ............. H03K 19/00376 327/512 |
| 2007/0075781 A1 | * | 4/2007 | Yasuda | ................... H03F 1/523 330/296 |

* cited by examiner

*Primary Examiner* — Henry Choe
(74) *Attorney, Agent, or Firm* — Chang & Hale LLP

(57) ABSTRACT

A clamp circuit comprises a first diode stack comprising one or more diodes and an array comprising a second diode stack comprising one or more diodes and a comparator configured to compare a first voltage at the first diode stack to a second voltage at the second diode stack.

13 Claims, 8 Drawing Sheets

POWER AMPLIFIER JUNCTION TEMPERATURE CLAMP

CROSS-REFERENCE TO RELATED APPLICATION

This application claims priority to U.S. Provisional Application No. 63/249,856 filed Sep. 29, 2021, entitled POWER AMPLIFIER JUNCTION TEMPERATURE CLAMP, the disclosure of which is hereby expressly incorporated by reference herein in its respective entirety.

BACKGROUND

Some embodiments of the present disclosure relate to power amplifiers and/or clamp circuits of power amplifiers.

The reliability of a power amplifier (e.g., a long-term evolution (LTE) power amplifier) may be limited by two key parameters: (1) maximum junction temperature(s) of one or more transistors of the power amplifier, and/or (2) voltage breakdown(s) of the one or more transistors. Some embodiments of the present disclosure may provide improved reliability of a power amplifier through limiting the maximum junction temperature(s) of the transistor(s) to safe operating levels.

Power, current, and/or junction temperature values of a power amplifier may be affected by various factors, including load voltage standing wave ratio (VSWR) (e.g., 2:1, 6:1, and 10:1) and/or ambient temperature (e.g., 25° C.). The maximum junction temperatures of a power amplifier may be much higher than the ambient temperature.

SUMMARY

Some implementations of the present disclosure relate to a clamp circuit including: a first diode stack including one or more diodes; and an array including: a second diode stack including one or more diodes; and a comparator configured to compare a first voltage at the first diode stack to a second voltage at the second diode stack.

In some aspects, the techniques described herein relate to a clamp circuit further including coupling circuitry configured to couple the comparator between the first diode stack and the second diode stack.

In some aspects, the techniques described herein relate to a clamp circuit wherein the first diode stack includes two or more series-connected diodes.

In some aspects, the techniques described herein relate to a clamp circuit wherein the second diode stack includes two or more series-connected diodes.

In some aspects, the techniques described herein relate to a clamp circuit wherein the comparator is integrated within a silicon semiconductor die.

In some aspects, the techniques described herein relate to a clamp circuit wherein the first diode stack is thermally isolated from the array.

In some aspects, the techniques described herein relate to a clamp circuit further including a first resistor and a first current source.

In some aspects, the techniques described herein relate to a clamp circuit further including coupling circuitry configured to couple the first diode stack, the first resistor, and the first current source at a first node.

In some aspects, the techniques described herein relate to a clamp circuit wherein the comparator includes a first voltage source, a first transistor, and a second transistor.

In some aspects, the techniques described herein relate to a clamp circuit wherein the comparator further includes a third transistor.

In some aspects, the techniques described herein relate to a clamp circuit further including coupling circuitry configured to couple an emitter of the first transistor, an emitter of the second transistor, and a source of the third transistor at a first node.

In some aspects, the techniques described herein relate to a clamp circuit wherein the comparator further includes a fourth transistor.

In some aspects, the techniques described herein relate to a clamp circuit further including coupling circuitry configured to couple a base of the third transistor to a base of the fourth transistor.

In some aspects, the techniques described herein relate to a method including: placing a first diode network within a power amplifier array; placing a second diode network outside the power amplifier array, the second diode network having an area, current, and resistance configured to match voltage at the second diode network to the first diode network at normal operating conditions; and placing a comparator between the first diode network and the second diode network to maintain approximately matched voltage at the first diode network and the second diode network.

In some aspects, the techniques described herein relate to a method wherein the comparator includes a first voltage source, a first transistor, and a second transistor.

In some aspects, the techniques described herein relate to a method wherein the comparator further includes a third transistor.

In some aspects, the techniques described herein relate to a method further including coupling circuitry configured to couple an emitter of the first transistor, an emitter of the second transistor, and a source of the third transistor at a first node.

In some aspects, the techniques described herein relate to a circuit including: a controller configured to drive a current; and a power amplifier configured to receive the current from the controller, the power amplifier including: an array including one or more transistors; a first diode stack that is thermally isolated from the array; a second diode stack that is thermally coupled to the array and configured to receive a voltage approximately equal to a voltage of the array; and a comparator coupled between the first diode stack and the second diode stack and configured to receive a voltage approximately equal to the voltage of the array.

In some aspects, the techniques described herein relate to a circuit wherein the comparator is further configured to draw current away from the array when a temperature difference between the first diode stack and the second diode stack exceeds a threshold value.

In some aspects, the techniques described herein relate to a circuit wherein the comparator includes a first voltage source, a first transistor, and a second transistor.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DESCRIPTION

The headings provided herein, if any, are for convenience only and do not necessarily affect the scope or meaning of the claimed invention.

The reliability of a power amplifier (e.g., a long-term evolution (LTE) power amplifier) may be limited by two key parameters: (1) maximum junction temperature(s) of one or more transistors of the power amplifier, and/or (2) voltage breakdown(s) of the one or more transistors. Some embodiments of the present disclosure may provide improved reliability of a power amplifier through limiting the maximum junction temperature(s) of the transistor(s) to safe operating levels.

Power, current, and/or junction temperature values of a power amplifier may be affected by various factors, including load voltage standing wave ratio (VSWR) (e.g., 2:1, 6:1, and 10:1) and/or ambient temperature (e.g., 25° C.). The maximum junction temperatures of a power amplifier may be much higher than the ambient temperature.

High junction temperatures may result in lower operating life of a power amplifier. For example, a high junction temperature of a power amplifier may result in an approximately 50× reduction in operating lifetime over the recommended maximum junction temperature. High junction temperatures may also cause the power amplifier to be more susceptible to thermal runaway.

Some power amplifiers may utilize a current limiting circuit to limit the current into the power amplifier under mismatch conditions. Limiting the current may reduce the power at the power amplifier, but may not significantly reduce the junction temperatures at the power amplifier. Some power amplifiers may additionally or alternatively have a relatively large size to spread the dissipated power (i.e., heat) over a greater area.

A power amplifier may be vulnerable to ruggedness failures when the power amplifier dissipates a relatively large amount of power. For example, a power amplifier may experience ruggedness failures in response to relatively high input power, high common collector voltage (Vcc), and/or high load VSWR. When a relatively high amount of power is dissipated in the array, it may indicate that the power amplifier may be in a mismatch condition. In response to this, some embodiments of the present disclosure may involve pulling back the input power and/or bias.

Embodiments described herein may involve directly controlling temperature values of a power amplifier and/or limiting the maximum junction temperature with minimal size impact. Some embodiments may involve setting a temperature clamp limit of a power amplifier such that the power amplifier may not engage into a 2:1 mismatch. A power amplifier may comprise one or more (e.g., two) diodes which may be situated at one side (e.g., a "cold" side) and/or outside an array of a semiconductor die. The power amplifier may additionally or alternatively comprise one or more (e.g., two) diodes embedded in an array of the power amplifier.

Figure 1:
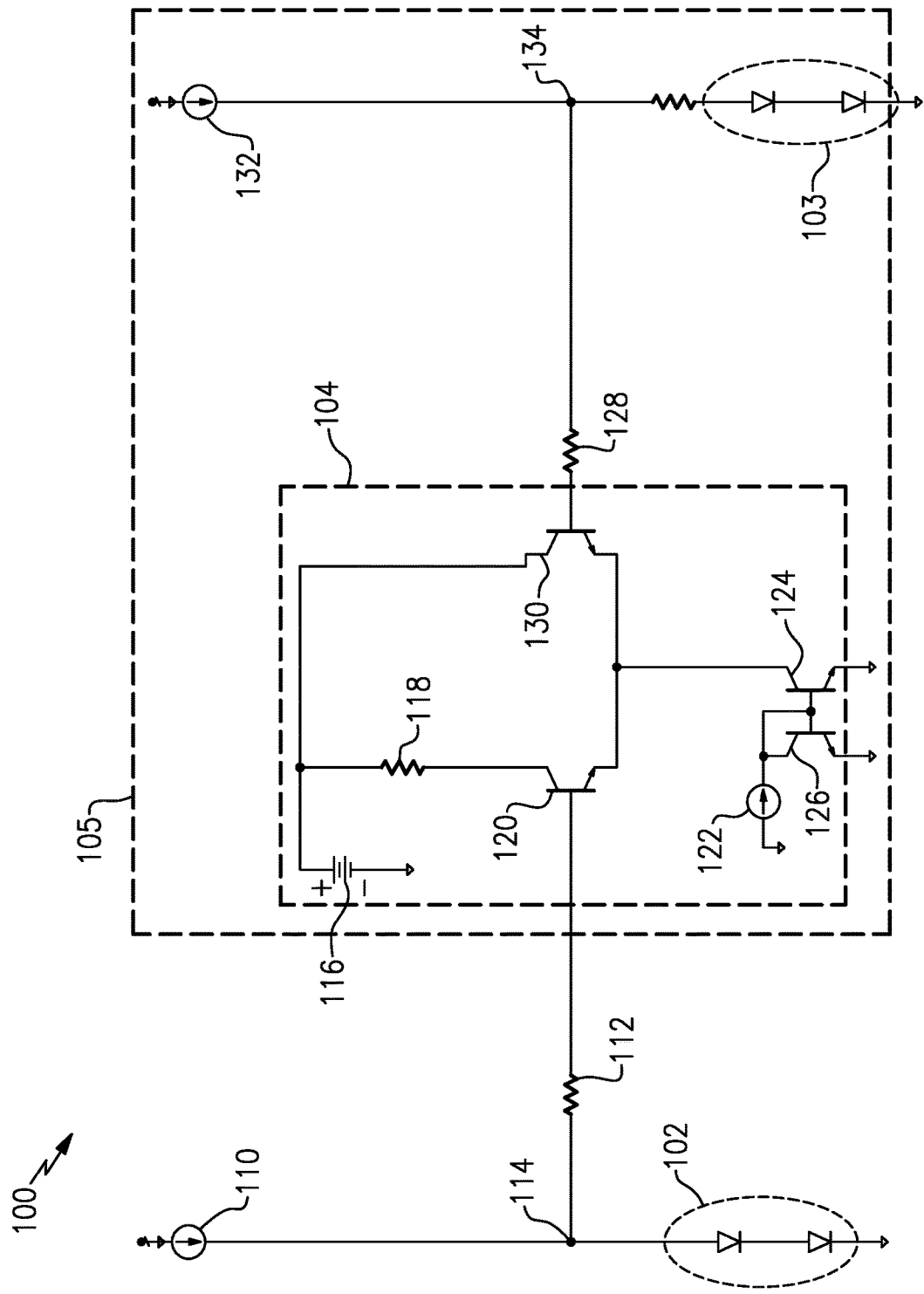
FIG. 1 illustrates an example clamp circuit configured to manage junction temperature of a power amplifier in accordance with one or more embodiments.

FIG. 1 illustrates an example clamp circuit 100 configured to manage junction temperature of a power amplifier in accordance with one or more embodiments. The clamp circuit 100 may comprise a portion of a power amplifier semiconductor die. In some embodiments, the clamp circuit 100 may comprise at least a first diode stack 102 and/or a second diode stack 103. The first diode stack 102 and/or second diode stack 103 may comprise one or more series-connected diodes. The power amplifier may comprise an array 105 comprising any of a variety of circuit components, which can include the second diode stack 103. The first diode stack 102 may be situated outside the array 105 and/or may be configured to experience an ambient temperature regardless of junction temperatures of the power amplifier and/or array 105.

In some embodiments, a power amplifier and/or the clamp circuit 100 may comprise a comparator 104 configured to compare a voltage at the first diode stack 102 to a voltage at the second diode stack 103. The comparator 104 may be configured to be integrated within a silicon semiconductor die. Diode area, reference currents, and/or offset resistance of the power amplifier may be scaled such that the first diode stack 102 and the second diode stack 103 experience an approximately equal voltage when a temperature of the array 105 of the power amplifier is greater than an ambient temperature and/or a temperature at the first diode stack 102 by a threshold value. For example, the first diode stack 102 may have an equal voltage to the second diode stack 103 when the temperature of the array 105 is 150° C. hotter than the ambient temperature and/or the temperature at the first diode stack 102. In some embodiments, the threshold value can be scaled and/or trimmed based on the reference currents from a controller of the clamp circuit 100.

An output of the comparator 104 may be configured to pull back on a driver stage bias to keep the array 105 at or near the threshold value. In some embodiments, the array 105 of a power amplifier may never reach an upper maximum temperature value (e.g., a value at which the array 105 and/or power amplifier may be vulnerable to breakdown). In some embodiments, pullback may be configured not to engage under nominal conditions and/or may be configured to engage only under high VSWR where an amount of dissipated power is high.

The first diode stack 102 may be coupled (e.g., via coupling circuitry) to a first resistor 112 and a first current source 110 at a first node 114. The comparator 104 may be coupled between the first resistor 112 and a second resistor 128. The comparator 104 may comprise a direct current voltage source 116 providing voltage to a first transistor 120 and/or a second transistor 130 of the comparator 104. A third resistor may be coupled between a collector of the first transistor 120 and the voltage source 116. A source of the second transistor 130 may be coupled to the voltage source 116. An emitter of the first transistor 120, an emitter of the second transistor 130, and/or a source of a third transistor 124 of the comparator 104 may be coupled at a second node. A base of the first transistor 120 may be coupled to the first resistor 112 and/or a base of the second transistor 130 may be coupled to the second resistor 128.

A base of the third transistor 124 may be coupled to a base of a fourth transistor 126. A source of the fourth transistor 126 and/or the bases of the third transistor 124 and/or fourth transistor 126 may be coupled to a second current source 122. The second resistor 128, a third current source 132, and/or the second diode stack 103 may be coupled at a third node 134. A fourth resistor may be coupled between the third node 134 and the diode stack 103.

The position of the comparator 104 may allow the comparator 104 to sense a temperature difference between the first diode stack 102 and the second diode stack 103. For example, at least a portion of the comparator 104 may be configured to experience a voltage drop approximately equivalent to a voltage drop at one or more transistors of an array of the power amplifier. As the voltage drop at the array increase, the voltage drop at the comparator 104 may similarly increase and/or the comparator 104 may be configured to draw current away from the power amplifier array due at least in part to the increased voltage at the comparator 104. The comparator 104 may be configured to draw current form the power amplifier array when a temperature difference between the first diode stack 102 and the second diode stack 103 exceeds a threshold value.

A pullback driver bias may be based on and/or equivalent to a signal and/or current value through a fifth resistor 118 and/or into a source of the first transistor 120. The fifth resistor 118 may be coupled to the voltage source 116.

Figure 2:
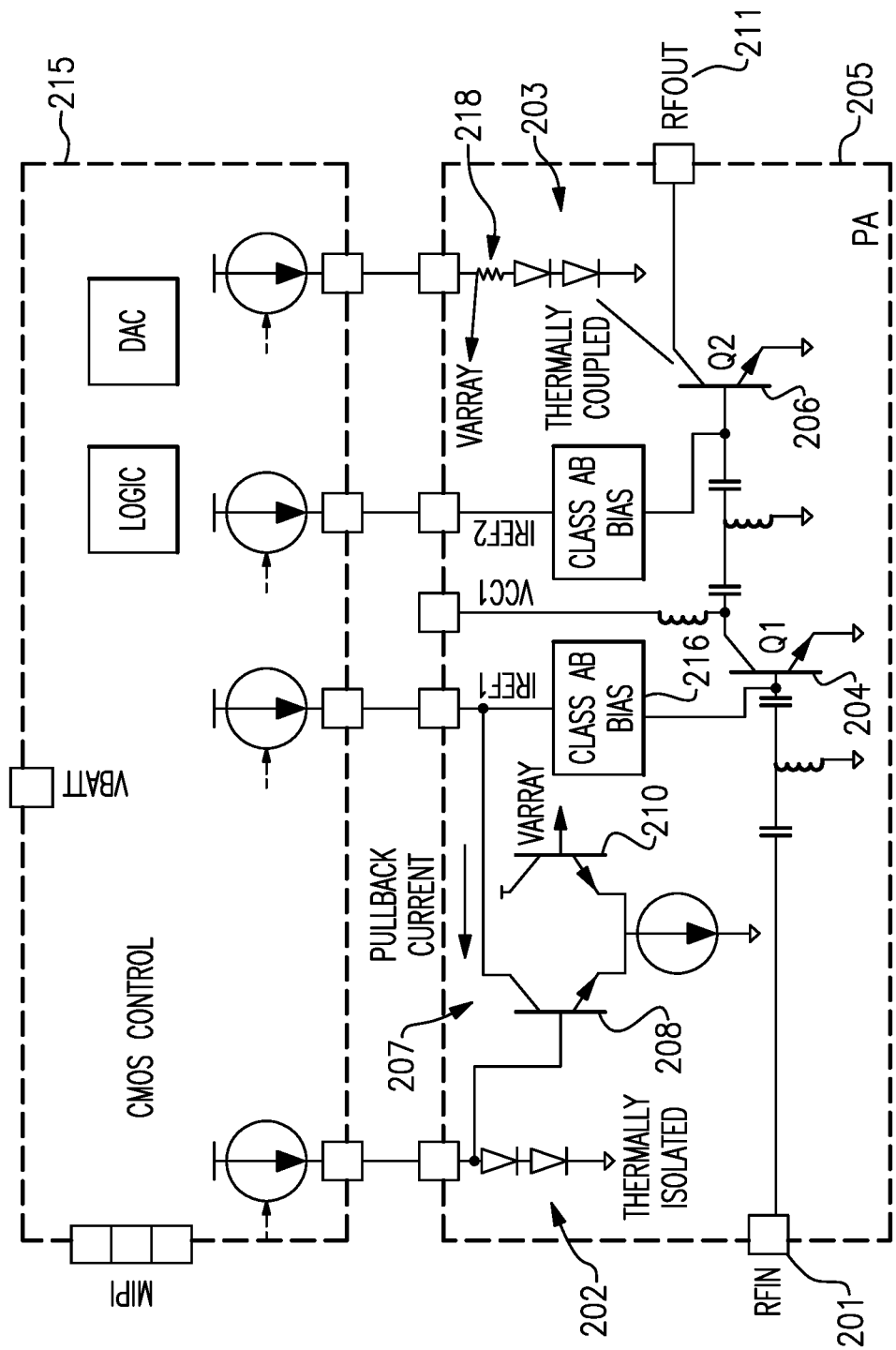
FIG. 2 illustrates another example circuit configured to manage junction temperatures within a power amplifier in accordance with one or more embodiments.

FIG. 2 illustrates another example circuit configured to manage junction temperatures within a power amplifier 205 in accordance with one or more embodiments. The power amplifier 205 comprises at least a first diode stack 202 and a second diode stack 203. Each of the first diode stack 202 and the second diode stack 203 may comprise one or more series-connected diodes. In some embodiments, the first diode stack 202 may be thermally isolated from an array of the power amplifier 205 and/or the second diode stack 203 may be thermally coupled to the array of the power amplifier. For example, the second diode stack 203 may be situated proximal to one or more transistors of the power amplifier 205.

A controller 215 may be configured to drive the power amplifier 205. Current from the controller 215 may be configured to travel via a first bias stage 216 (e.g., a class AB bias) of the power amplifier 205 and/or to a first transistor 204 and/or first driver stage of the power amplifier 205. A base of the first transistor 204 may be coupled to the first bias stage 216. A source of the first transistor may be coupled to a base of a second transistor 206 and/or second driver stage of the power amplifier 205. A source of the second transistor 206 may be coupled to an RF output node 211. The second diode stack 203 may be coupled near the second transistor 206 such that a temperature at the second transistor 206 is approximately equal to a temperature at the second diode stack 203. The second diode stack 203 may be coupled to a first resistor 218 and/or may have an array voltage (VArray) across the second diode stack 203 based at least in part by the thermal coupling of the second diode stack 203 to the second transistor 206.

The first diode stack 202 may be coupled to a comparator 207 comprising a third transistor 208 and a fourth transistor 210. For example, the first diode stack 202 may be coupled to a base of the third transistor 208. An emitter of the third transistor 208 may be coupled to an emitter of the fourth transistor 210. The fourth transistor 210 and/or a base of the fourth transistor 210 may be configured to have a voltage equal to the array voltage (VArray). A source of the third transistor 208 may be coupled to the first bias stage 216 and/or to a current source from the controller 215. When the array voltage is relatively low (e.g., as a result of a temperature difference between the second diode stack 203 and the first diode stack 202 being below a threshold value), current from the controller may pass through the first bias stage 216. As the array voltage increases (e.g., as a result of temperature at the second transistor 206 and/or second diode stack 203 increasing above a temperature at the first diode stack 202 beyond the threshold value), increased current may be drawn from the controller 215 toward the third transistor 208. In this way, current may be drawn away from the array of the power amplifier 205 to prevent voltage and/or temperature increases at the array after the threshold value is reached.

A reference current into the source of the third transistor 208 may represent a pullback current and/or a current configured to pull back the array voltage.

In some embodiments, the controller 215 may be configured to provide multiple current and/or voltage sources to the power amplifier 205. For example, the controller 215 may be configured to provide a first reference current to the first bias stage 216 and/or a second reference current to a second bias stage. The second bias stage, the base of the second transistor, and/or a capacitor may be coupled together at a node. The controller 215 may further provide current inputs to the first diode stack 202 and/or the second diode stack 203. A voltage source (VCC1) may be coupled to an inductor and/or the inductor, a source of the first transistor 204, and/or a capacitor may be coupled together at a node.

Figure 3:
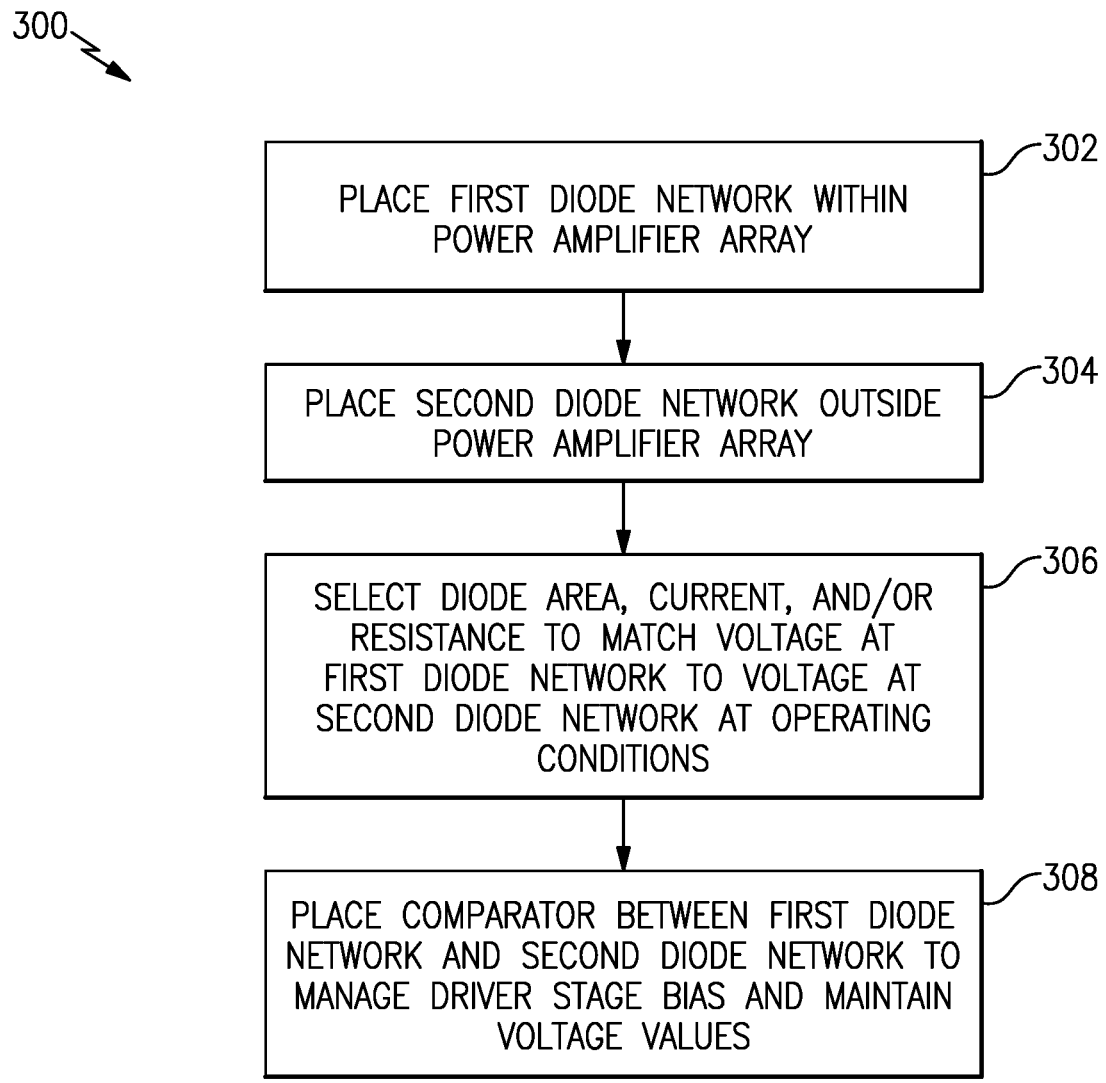
FIG. 3 provides a flowchart illustrating an example process for managing junction temperatures at a power amplifier in accordance with one or more embodiments.

FIG. 3 provides a flowchart illustrating an example process 300 for managing junction temperatures at a power amplifier in accordance with one or more embodiments. At block 302, the process 300 involves placing a first diode network comprising one or more series-connected diodes within an array of a power amplifier. The first diode network may be thermally coupled to one or more array components of the power amplifier.

At block 304, the process 300 involves placing a second diode network comprising one or more series-connected diodes outside the power amplifier array. The second diode network may be thermally isolated from one or more components of the power amplifier array and/or may be configured to experience an ambient temperature.

At block 306, the process 300 involves selecting current values of the power amplifier, resistance values of the power amplifier, and/or diode area of the first diode network and/or second diode network to match voltage values at the first diode network to voltage values at the second diode network and/or at a comparator coupled to the second diode network. As a result, voltage increases at the array of the power amplifier can cause voltage increases at the second diode network and/or at the comparator.

At block 308, the process 300 involves coupling a comparator between the first diode network and the second diode network to manage driver stage bias and/or to maintain voltage values within the array below a level that results in damaging junction temperatures within the array of the power amplifier.

Figure 4:
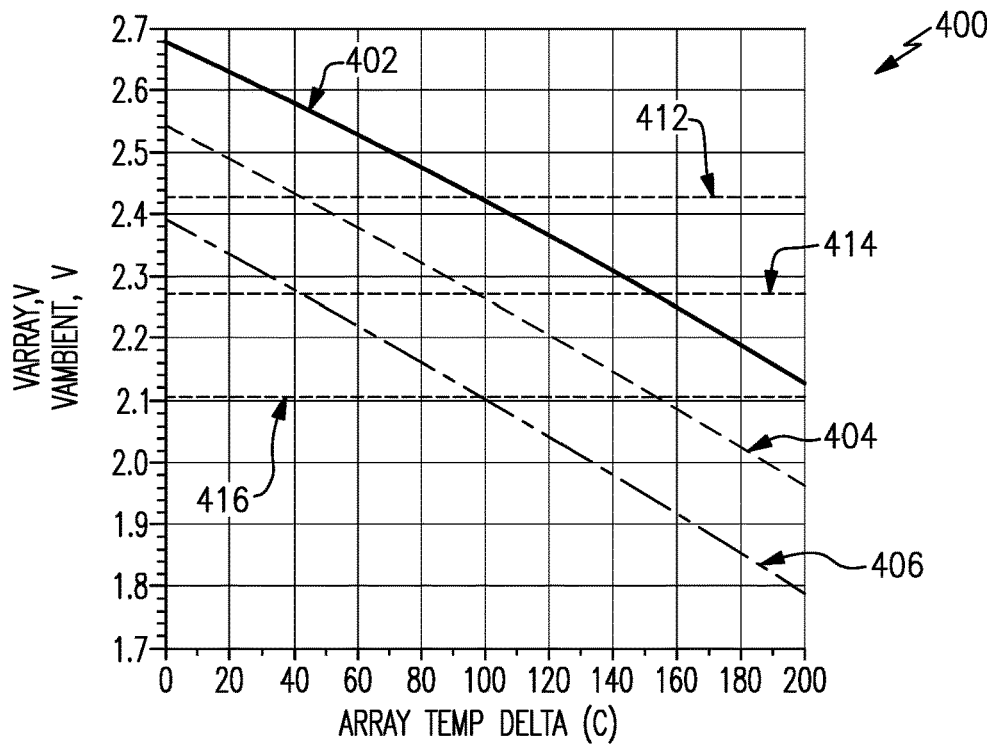
FIG. 4 provides a graph illustrating a comparison between reference voltage and an array temperature delta (in Celsius) for various junction temperatures, including a first temperature (e.g., −25-degrees Celsius), a second temperature (e.g., 25-degrees Celsius), and/or a third temperature (e.g., 85-degrees Celsius).

FIG. 4 provides a graph 400 illustrating a comparison between reference voltage and an array temperature delta (in Celsius) for various junction temperatures, including a first temperature (e.g., −25-degrees Celsius), a second temperature (e.g., 25-degrees Celsius), and/or a third temperature (e.g., 85-degrees Celsius). The first temperature may be associated with a first array voltage 402 plot and/or a first ambient voltage 412 value, the second temperature may be associated with a second array voltage 404 plot and/or a second ambient voltage 414 value, and/or the third temperature may be associated with a third array voltage 406 plot and/or a third ambient voltage 416 value. For example, a voltage at one or more thermally coupled diodes on a power amplifier array as described herein may decrease as a difference between the array temperature and the ambient temperature increases. The voltage at one or more thermally isolated diodes outside the array may remain constant. A temperature delta value at which the first array voltage 402 plot meets the first ambient voltage 412 value, the second array voltage 404 plot meets the second ambient voltage 414 value, and/or the third array voltage 406 plot meets the third ambient voltage 416 value may represent a threshold temperature delta. In the example shown in the graph 400, the threshold temperature delta may be approximately 100-degrees Celsius. In the power amplifier designs described herein, reference currents, diode areas, and/or offset resistor vales may be set and/or designed to trigger when the temperature delta (e.g., the difference between the array temperature of the power amplifier from the ambient temperature and/or temperature at the thermally isolated diodes) is slightly less than or equal to the threshold temperature delta (e.g., approximately 80-degrees Celsius in the example shown in FIG. 4).

Figure 5:
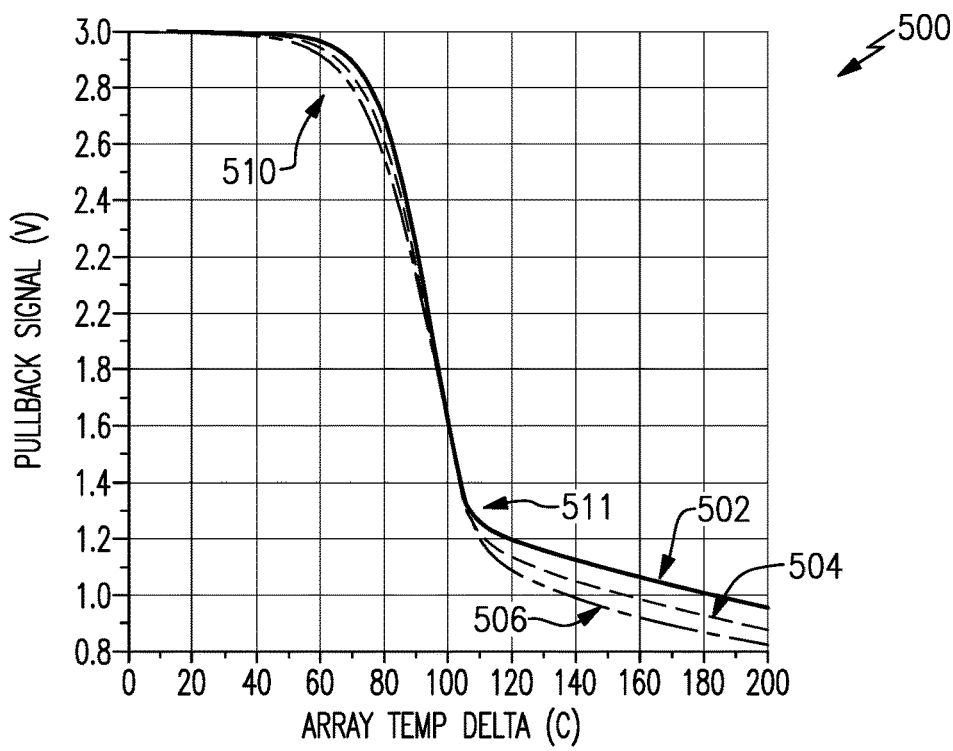
FIG. 5 provides a graph illustrating pullback signal voltage for varying array temperature delta values (in Celsius) in accordance with one or more embodiments.

FIG. 5 provides a graph 500 illustrating pullback signal voltage for varying array temperature delta values (in Celsius) in accordance with one or more embodiments. The graph 500 illustrates how the example circuits described herein may be configured to pull back on an array voltage of a power amplifier in response to the array voltage increasing beyond a threshold amount with respect to a voltage at a thermally isolated diode network. The graph 500 illustrates the pullback voltage values for a first temperature 502 (e.g., −25-degrees Celsius), a second temperature 504 (e.g., 25-degrees Celsius), and/or a third temperature 506 (e.g., 85-degrees Celsius). In the example shown in FIG. 5, a pullback signal (e.g., a voltage source) may be configured to decrease in voltage and/or current at a first array temperature delta value 510 and/or when a difference between a temperature at the power amplifier array exceeds a temperature outside the array by approximately 60-degrees Celsius to prevent the array from becoming too hot. The pullback signal may begin leveling out at a second array temperature delta value 511, which may ensure that the array of the power amplifier does not reach vulnerable temperatures.

Figure 6:
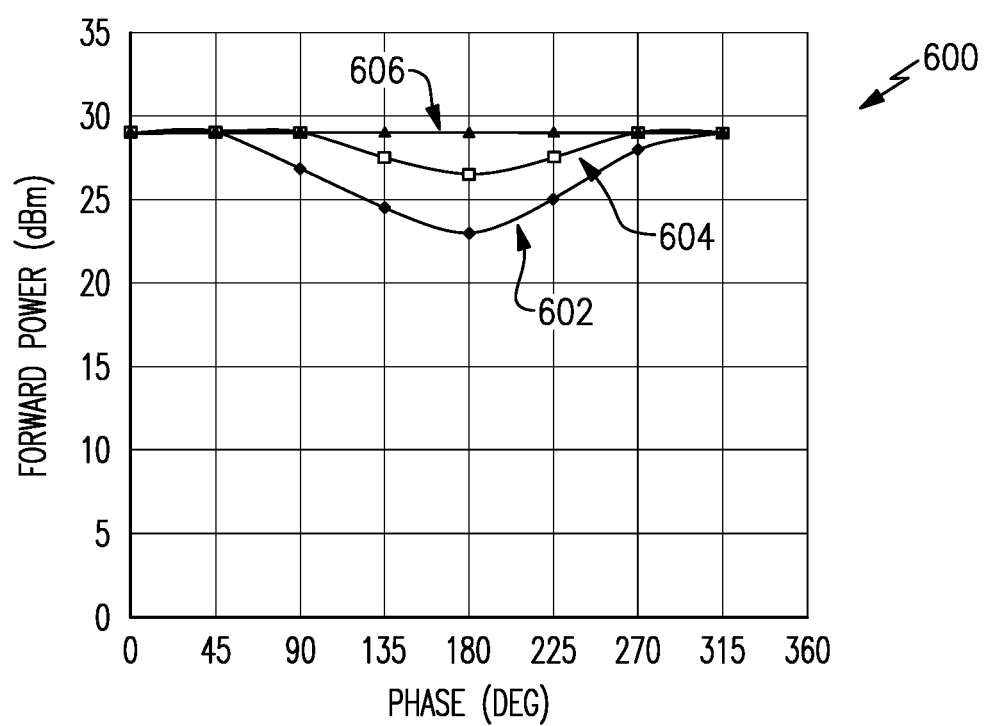
FIG. 6 provides a graph illustrating forward power values (e.g., into a 10:1 VSWR mismatch and/or set to 29 dBm) with respect to phase values for example circuits.

FIG. 6 provides a graph 600 illustrating forward power values (e.g., into a 10:1 VSWR mismatch and/or set to 29 dBm) with respect to phase values for example circuits. The graph 600 includes plots for an example temperature clamp circuit 602 as described herein, a current clamp circuit 604, and a circuit 606 having no clamp. As shown in FIG. 6, the temperature clamp circuit 602 may be configured to more effectively limit power at high VSWR, which may be particularly beneficial for post-power amplifier filter and/or switch ruggedness.

Figure 7:
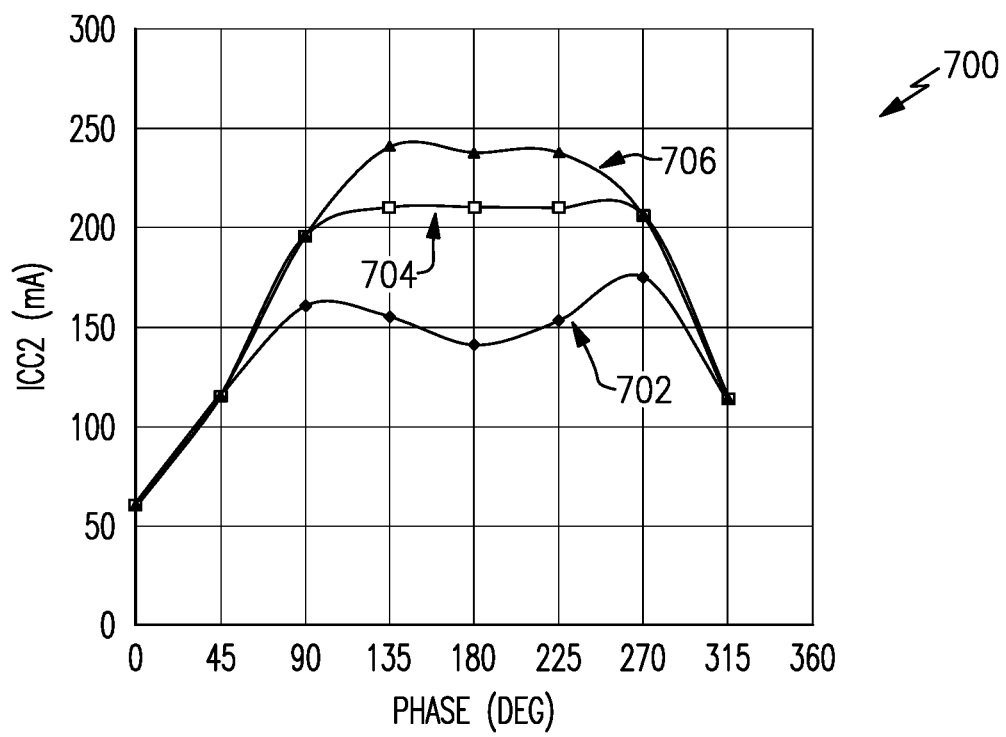
FIG. 7 provides a graph illustrating current values (e.g., into a 10:1 VSWR mismatch and/or set to 29 dBm) with respect to phase values for example circuits.

FIG. 7 provides a graph 700 illustrating current values (e.g., into a 10:1 VSWR mismatch and/or set to 29 dBm) with respect to phase values for example circuits. The graph 700 includes plots for an example temperature clamp circuit 702 as described herein, a current clamp circuit 704, and a circuit 706 having no clamp. As shown in FIG. 7, the temperature clamp circuit 702 may be configured to more effectively limit current at high VSWR.

Figure 8:
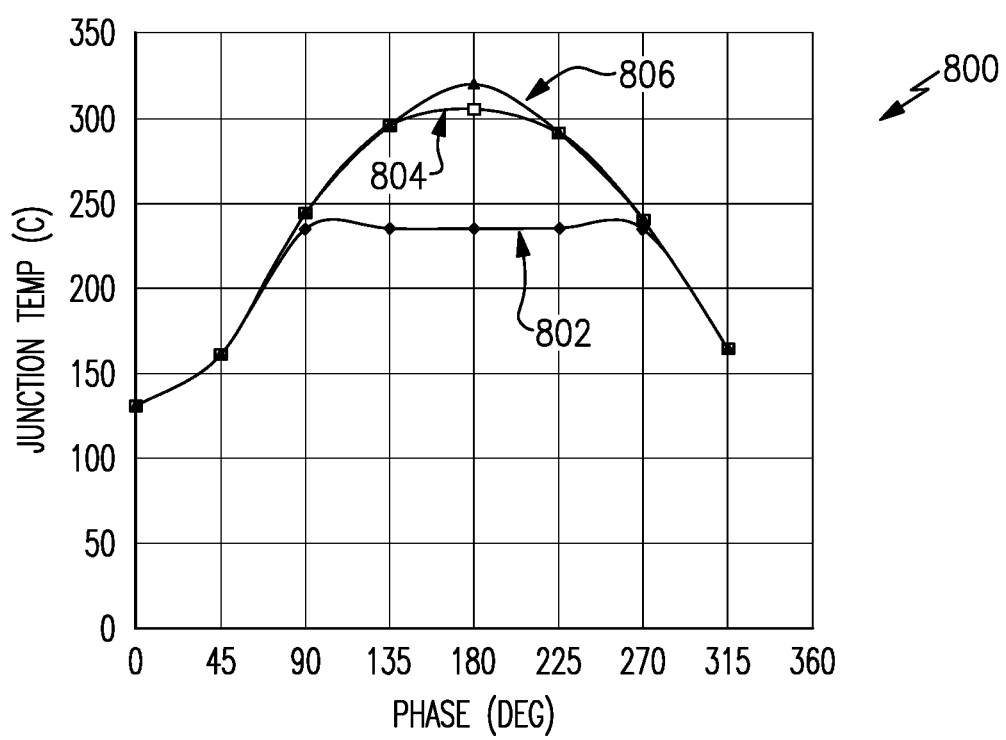
FIG. 8 provides a graph illustrating junction temperature values (e.g., into a 10:1 VSWR mismatch and/or set to 29 dBm) with respect to phase values for example circuits.

FIG. 8 provides a graph 800 illustrating junction temperature values (e.g., into a 10:1 VSWR mismatch and/or set to 29 dBm) with respect to phase values for example circuits. The graph 800 includes plots for an example temperature clamp circuit 802 as described herein, a current clamp circuit 804, and a circuit 806 having no clamp. As shown in FIG. 8, the temperature clamp circuit 802 may be configured to more effectively reduce junction temperature and/or can trim junction temperature to any desired value.

Figure 9:
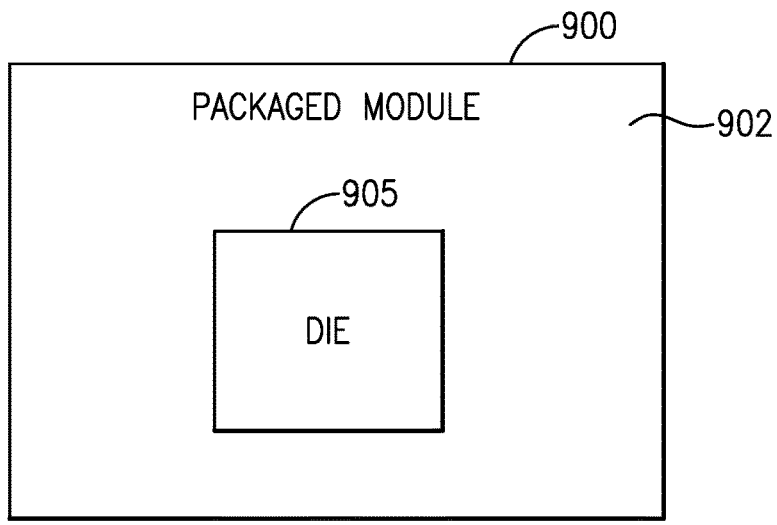
FIG. 9 shows a die implemented in a packaged module.

FIG. 9 shows a die 905 implemented in a packaged module 900. Such a packaged module can include a packaging substrate 902 configured to receive a plurality of components.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart phone, a hand-held wireless device with or without phone functionality, a wireless tablet, etc.

Figure 10:
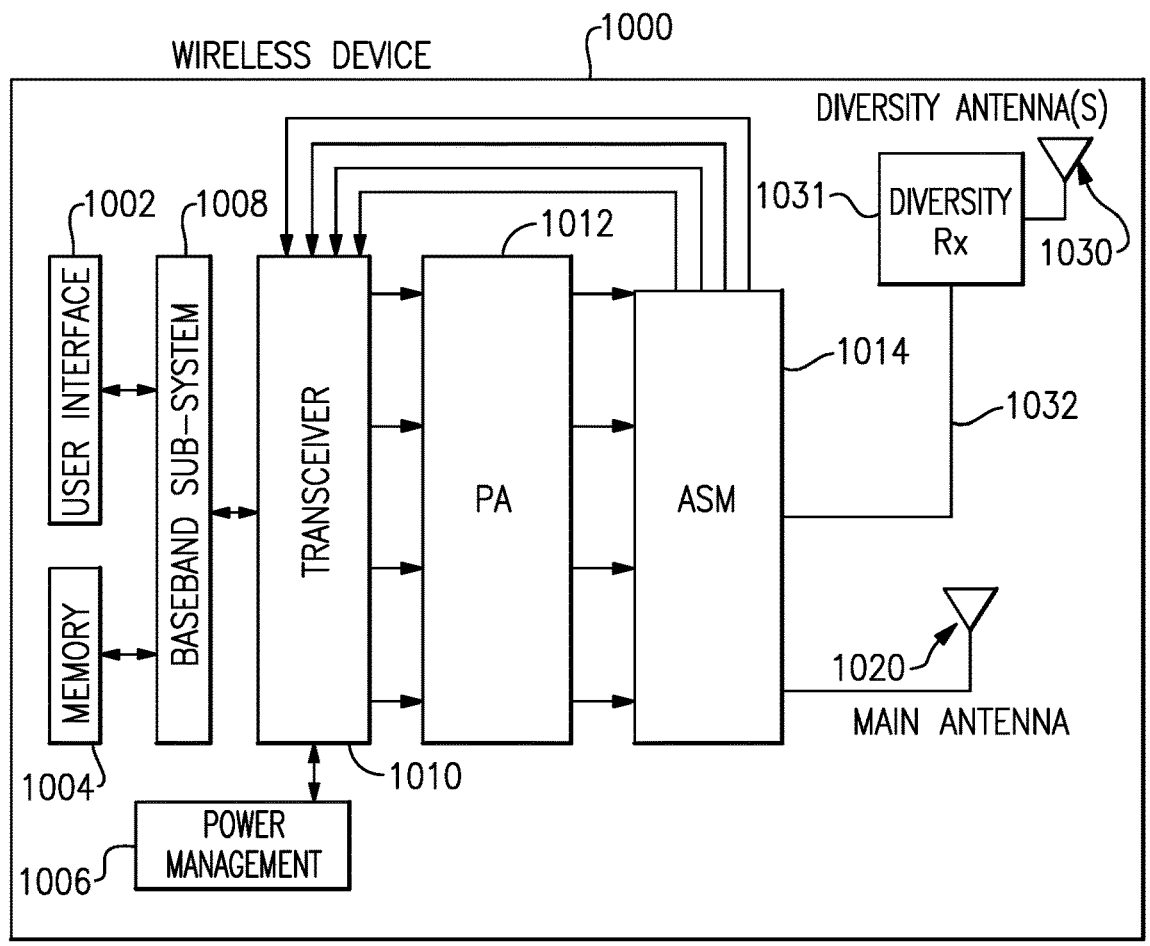
FIG. 10 depicts an example wireless device having one or more advantageous features described herein.

FIG. 10 depicts an example wireless device 1000 having one or more advantageous features described herein. In some embodiments, a module 900 as in FIG. 9 that includes one or more power amplifiers can also include one or more clamps having one or more features as described herein.

In the example of FIG. 10, power amplifiers (PAs) are depicted in a PA module 1012; however, it will be understood that such power amplifiers can be implemented in one or more functional blocks, one or more devices such as die or modules, etc. Such power amplifiers can receive their respective RF signals from a transceiver 1010 that can be configured and operated to generate RF signals to be amplified and transmitted, and to process received signals. The transceiver 1010 is shown to interact with a baseband sub-system 1008 that is configured to provide conversion between data and/or voice signals suitable for a user and RF signals suitable for the transceiver 1010. The transceiver 1010 is also shown to be connected to a power management component 1006 that is configured to manage power for the operation of the wireless device 1000. Such power management can also control operations of the baseband sub-system 1008 and other components of the wireless device 1000.

The baseband sub-system 1008 is shown to be connected to a user interface 1002 to facilitate various input and output of voice and/or data provided to and received from the user. The baseband sub-system 1008 can also be connected to a memory 1004 that is configured to store data and/or instructions to facilitate the operation of the wireless device, and/or to provide storage of information for the user.

In the example of FIG. 10, a diversity receive (DRx) module 1031 can be implemented between one or more diversity antennas (e.g., diversity antenna 1030) and the front-end module. Such a configuration can allow an RF signal received through the diversity antenna 1030 to be processed (in some embodiments, including amplification by an LNA) with little or no loss of and/or little or no addition of noise to the RF signal from the diversity antenna 1030. Such processed signal from the DRx module 1040 can then be routed to the front-end module through one or more signal paths. In some embodiments, the wireless device 1000 may or may not include the foregoing DRx functionality.

In the example of FIG. 10, a plurality of antennas (e.g., 1020*a*, 1020*b*) can be configured to, for example, facilitate transmission of RF signals from the PA module 1012. In some embodiments, receive operations can also be achieved through some or all of the antennas 1020*a*, 1020*b*.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A clamp circuit comprising:
a first diode stack comprising one or more diodes; and
an array comprising:
a second diode stack comprising one or more diodes; and
a comparator configured to compare a first voltage at the first diode stack to a second voltage at the second diode stack, the comparator including a first voltage source, a first transistor, a second transistor, a third transistor, and a fourth transistor, a base of the third transistor being coupled to a base of the fourth transistor.

2. The clamp circuit of claim 1 further comprising coupling circuitry configured to couple the comparator between the first diode stack and the second diode stack.

3. The clamp circuit of claim 1 wherein the first diode stack comprises two or more series-connected diodes.

4. The clamp circuit of claim 3 wherein the second diode stack comprises two or more series-connected diodes.

5. The clamp circuit of claim 1 wherein the comparator is integrated within a silicon semiconductor die.

6. The clamp circuit of claim 1 wherein the first diode stack is thermally isolated from the array.

7. The clamp circuit of claim 1 further comprising a first resistor and a first current source.

8. The clamp circuit of claim 7 further comprising coupling circuitry configured to couple the first diode stack, the first resistor, and the first current source at a first node.

9. The clamp circuit of claim 1 further comprising coupling circuitry configured to couple an emitter of the first transistor, an emitter of the second transistor, and a source of the third transistor at a first node.

10. A method comprising:
placing a first diode network within a power amplifier array;
placing a second diode network outside the power amplifier array, the second diode network having an area, current, and resistance configured to match voltage at the second diode network to the first diode network at normal operating conditions; and
placing a comparator between the first diode network and the second diode network to maintain approximately matched voltage at the first diode network and the second diode network, the comparator including a first voltage source, a first transistor, a second transistor, a third transistor, and a fourth transistor, a base of the third transistor being coupled to a base of the fourth transistor.

11. The method of claim 10 further comprising coupling circuitry configured to couple an emitter of the first transistor, an emitter of the second transistor, and a source of the third transistor at a first node.

12. A circuit comprising:
a controller configured to drive a current; and
a power amplifier configured to receive the current from the controller, the power amplifier comprising:
an array comprising one or more transistors;
a first diode stack that is thermally isolated from the array;
a second diode stack that is thermally coupled to the array and configured to receive a voltage approximately equal to a voltage of the array; and
a comparator coupled between the first diode stack and the second diode stack and configured to receive a voltage approximately equal to the voltage of the array, the comparator including a first voltage source, a first transistor, a second transistor, a third transistor, and a fourth transistor, a base of the third transistor being coupled to a base of the fourth transistor.

13. The circuit of claim 12 wherein the comparator is further configured to draw current away from the array when a temperature difference between the first diode stack and the second diode stack exceeds a threshold value.

* * * * *